(12) United States Patent
Ogura et al.

(10) Patent No.: US 6,772,514 B2
(45) Date of Patent: Aug. 10, 2004

(54) METHOD OF MACHINING GLASS SUBSTRATE AND METHOD FABRICATING HIGH-FREQUENCY CIRCUIT

(75) Inventors: Hiroshi Ogura, Machida (JP); Yuji Hashidate, Tama (JP); Hiroyoshi Yajima, Sagamihara (JP); Yoshikazu Yoshida, Kawagoe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 240 days.

(21) Appl. No.: 09/878,265

(22) Filed: Jun. 12, 2001

(65) Prior Publication Data

US 2002/0005805 A1 Jan. 17, 2002

(30) Foreign Application Priority Data

Jun. 12, 2000 (JP) ........................................ 2000-176183

(51) Int. Cl.$^7$ ................................................ H05K 3/02
(52) U.S. Cl. ............................ 29/846; 29/847; 65/17.2; 219/121.71
(58) Field of Search .......................... 29/825, 846, 852, 29/847; 65/17.2, 17.3, 392; 219/121.7, 121.6

(56) References Cited

U.S. PATENT DOCUMENTS

| | | | |
|---|---|---|---|
| 5,080,962 A | | 1/1992 | Hench |
| 5,196,041 A | * | 3/1993 | Tumminelli et al. .......... 65/30.1 |
| 5,634,955 A | * | 6/1997 | Araujo et al. ................. 65/17.2 |
| 6,031,201 A | | 2/2000 | Amako et al. |
| 6,563,079 B1 | * | 5/2003 | Umetsu et al. ......... 219/121.71 |

FOREIGN PATENT DOCUMENTS

| JP | 09-311237 | 12/1997 |
|---|---|---|
| JP | 10-029836 | 2/1998 |

OTHER PUBLICATIONS

Rudolph P, Bonse J, Kruger J, Kautek W; Femtosecond–and nanosecond–pulse laser ablation of bariumalumoboroscilicate glass; Dec. 28, 1999; Applied Physics A Materials Science & Processing: PP S763–S766.*
Makishima et al "Photochemical Hole Burning (PHB) of New Hybrid Materials Prepared by the Sol–Gel Process"; Chemical Abstracts, 118 Feb. 8, (1993); No. 6, Columbus, Ohio, U.S.A. (Abstract Only).
Veiko et al "Laser Methods of Control of Porous Silica Glass Strcutre"; Chemical Abstracts, 118 Jan. 25, (1993); No. 4, Columbus, Ohio, U.S.A. (Abstract Only).
*Materials Integration*, vol. 13, No. 3 (2000); "Interaction Between Light and Glass by Ultrashort Pulse Laser–Growing Frequency Conversion Crystal in Glass"; pp. 67–73.

* cited by examiner

*Primary Examiner*—Joseph J. Hail, III
*Assistant Examiner*—Alvin J Grant
(74) *Attorney, Agent, or Firm*—Browdy and Neimark, P.L.L.C.

(57) ABSTRACT

A method of machining a glass substrate by using a laser, in which a low-permittivity, low-dielectric-loss glass substrate capable of coping with mass production processes is made applicable as the substrate of a high-frequency circuit intended for microwave and millimeter-wave bands in particular. For that purpose, a glass substrate is provided in which the amount of air bubbles in glass is arbitrarily controlled to improve the workability of the substrate itself. Then, the glass substrate is machined while being irradiated with a pulsed laser for a plurality of times, thereby improving the machining shape of the glass substrate. Since glass substrates which are typically difficult to machine can be easily applied to the fabrication of high-frequency circuits, it becomes possible to supply high-performance circuits and apparatuses widely to the public.

2 Claims, 6 Drawing Sheets

METHOD OF MACHINING GLASS SUBSTRATE AND METHOD FABRICATING HIGH-FREQUENCY CIRCUIT

BACKGROUND OF THE INVENTION

1. Field of the Invention

The present invention relates to a method and apparatus for fabricating a high-frequency circuit substrate of which smaller dielectric losses are desired. In particular, the invention relates to a method of creating a circuit intended for higher frequency bands such as microwave bands and millimeter wave bands, and an apparatus using the same.

2. Description of Prior Art

It is desirable for substrates to be used in microwave, millimeter-wave, and other high-frequency circuits to be made of material having low-dielectric-loss properties so as to suppress dielectric losses in the circuits resulting from the substrates themselves.

FIG. 1 is an explanatory diagram showing that the inherent dielectric loss of a substrate's own affects a signal flowing on a transmission line. FIG. 1 is a cross-sectional view of the circuit substrate as cut perpendicular to the signal flowing on the transmission line. The reference numeral 101 represents the substrate, 102 the transmission line, 103 a ground electrode, and 104 electric lines of force occurring when an electric signal flows on the transmission line 102. As shown in FIG. 1, the passage of an electric signal through the transmission line 102 makes the electric lines of force 104 run inside the substrate 101. Here, the electric lines of force 104 undergo the influence of the dielectric loss (given by the value of dielectric loss tangent) inherent to the substrate 101. A loss on the transmission line is given by:

loss=factor×frequency of circuit in question×(permittivity of substrate)$^{1/2}$×dielectric loss of substrate (dielectric loss tangent).

The loss caused here converts into thermal energy, causing a phenomenon of heating the substrate.

Fabricating a high-frequency circuit involves the phenomenon described in FIG. 1. Therefore, a substrate having properties of lower permittivity and lower dielectric loss is selected for use. Substrates made of typical organic materials, at low frequencies, show the properties of lower permittivity and lower dielectric loss. In microwave and millimeter-wave bands of 1 GHz or higher, however, the substrates significantly deteriorate in permittivity due to the materials' potential polarization and frequency response, and thus are not often selected as substrates for use in high frequencies (approximately 1 GHz or higher). For high frequencies, it is common to select inorganic materials such as alumina (permittivity: approximately 9, dielectric loss tangent: approximately 0.001), zirconia (permittivity: approximately 8, dielectric loss tangent: approximately 0.001), and aluminum nitride (permittivity: approximately 8, dielectric loss tangent: approximately 0.001).

Glass such as quartz is low in permittivity (permittivity: approximately 4) and in dielectric loss (dielectric loss tangent: 0.001 or lower) as compared to the inorganic materials. Therefore, it seems to be a promising material for high-frequency substrates for microwave and millimeter-wave bands. However, it is difficult to apply partial machining required of circuit substrates such as "through hole formation" to glass. Accordingly, it has been seldom used for high-frequency circuit substrates heretofore.

When glass is selected as the substrate material, ultrasonic machining appears to be the effective means for forming through holes in the glass substrate. The reason why chemical processing methods such as etching are not used for glass machining is that glass is a stable material. That is, although glass can be etched by solutions of hydrofluoric acids, phosphoric acids, alkalis, or the like, etching rates are extremely low (nearly 1 μm/h or so). As for sandblasting, sandblasting is capable of in-depth machining only twice or so the thickness of a mask. For example, in the case of forming 100-μm-diameter through holes, the holes cannot be formed beyond 200 μm or so in depth, relative to the mask pattern having 100-μm openings. Here, no through hole can be made if the glass substrate is thicker than 200 μm.

When ultrasonic machining is used to machine a glass substrate, a 100-μm hole in a 500-μm-thick substrate can be made at a machining rate of 1 sec or faster. Besides, the shape of the tool (horn) used in the ultrasonic machining can be devised to make a plurality of holes at a time. Nevertheless, the ultrasonic machining wears the tool in operation, which requires a replacement with a new tool after several times of machining to glass substrates. In addition, there are limitations on the dimensions of the tools. Therefore, the ultrasonic machining is a method hard to apply to mass production processes of large area glass substrates.

Meanwhile, laser beam machining has been already applied to mass production processes including the formation of through holes in alumina substrates and the like intended for high-frequency circuits, without any limitations on substrate sizes. The laser beam machining is, thus, suitable for ordinary substrate machining, whereas its application to glass substrates gives rise to the following problems. A YAG laser, a typical solid-state laser, has a laser wavelength (1.06 μm) which is transparent to glass. Therefore, the YAG laser is hard to apply to glass machining. Concerning excimer laser machining, the present inventors made machining experiments on quartz glass of 500 μm in thickness by using a KrF excimer laser (wavelength: 0.248 μm), and obtained the following results. That is, through holes of the order of 100 μm in diameter could be made at an energy density of approximately 25 J/cm². Nevertheless, the process conditions had an extremely narrow range such that any smaller energy densities preclude the machining while any greater energy densities create large cracks in glass substrates. This means that the excimer laser machining is an inappropriate method for machining a glass substrate, in terms of application to mass production processes.

It is conceivable that the use of an $F_2$ excimer laser having a wavelength (0.157 μm) shorter than that of the KrF excimer laser could somewhat relax the narrow range of the process conditions for glass substrates. $F_2$ gas is, however, poisonous to humans and therefore the use of the $F_2$ excimer laser in mass production processes is unrealistic.

Now, turning to the case of machining a glass substrate by using an ultrashort-pulse laser so-called femtosecond laser which has a pulse width of no greater than $10^{-13}$ seconds. As described in e.g. "Interaction Between Light and Glass by Ultrashort Pulse Laser—Growing Frequency Conversion Crystal in Glass—" (pp. 67–73), *MATERIALS INTEGRATION* vol. 13, no. 3 (2000), the machining to the glass substrate is possible. However, due to high prices and high running costs of ultrashort-pulse laser systems, the application to mass production processes is difficult.

A machining method using a $CO_2$ laser that is used for forming through holes and the like in an alumina substrate can be adopted to execute the perforation of glass substrates under process conditions wider than for the excimer lasers.

In addition, since $CO_2$ laser systems are lower in price and in running costs than the other systems, it can be said that the $CO_2$ laser machining is a glass substrate machining method suited to mass production.

Nevertheless, machining glass substrates by using the $CO_2$ laser produces the problem to be described below.

FIG. 2 is a diagram showing the problem that arises when a glass substrate is machined by using a $CO_2$ laser of variable pulse width. In FIG. 2, the reference numeral 201 represents the glass substrate, and 202 a through hole formed by the laser. Moreover, 203 represents upheaval that occurs upon the formation of the through hole 202, 204 the hole diameter of the glass substrate 201 on the laser-irradiated side (top hole diameter), and 205 the diameter on the side opposite to the laser-irradiated side (bottom hole diameter). As shown in FIG. 2, the through hole 202, being formed in the glass substrate 201 by using the $CO_2$ laser of variable pulse width, has a tapered shape as seen in FIG. 2 with the upheaval 203 on the top rim. The ratio of the bottom hole diameter 205 to the top hole diameter 204 and the amount of the upheaval 203 can be modified by changing the pulse width of the laser to adjust the pulse energy applied to the glass substrate. It is impossible, however, to avoid the tapered shape and the upheaval phenomenon.

SUMMARY OF THE INVENTION

The present invention has been achieved in view of the conventional problems described above. It is thus a first object of the present invention to provide a laser-based glass substrate machining method capable of coping with mass production processes.

A second object of the present invention is to use this glass substrate machining method to make a low-permittivity, low-dielectric-loss glass substrate applicable as the substrate of a high-frequency circuit intended for microwave and millimeter-wave bands in particular.

A third object of the present invention is to use the above-mentioned substrate achieved by the glass substrate machining method to enhance performances of a radio terminal apparatus and the like.

The present invention is to achieve the foregoing objects through contrivances both to the glass substrate itself and to the laser beam machining method. Specifically, a glass substrate is provided in which the amount of air bubbles in glass is appropriately controlled to improve the workability of the substrate itself. Then, the glass substrate is irradiated with a pulsed laser over a plurality of times during machining, thereby improving the machining shape to the glass substrate.

To realize the technique as described above, the present invention features that the amount of air bubbles in the glass substrate is controlled to improve the laser workability of the glass substrate itself.

Moreover, the present invention provides a glass substrate machining method for machining a glass substrate by using a laser, comprising the step of controlling the amount of air bubbles in the glass substrate to improve the workability of the glass substrate, in which a thin insulator is formed on the glass surface. In this case, the thin insulator on the glass surface may be glass formed by coating. Alternatively, the insulator may be an organic insulator film. When the insulator is an organic insulator film, the thin organic insulator on the glass surface may be formed by coating. Furthermore, the thin insulator formed on the glass surface may be made into a sheet form by using a laminator.

In addition, the present invention provides a method for machining a glass substrate by using a laser, comprising the step of controlling the amount of air bubbles in the glass substrate to form a vacancy only inside of the glass substrate.

Moreover, the present invention provides a method of forming a metal film on a glass substrate, wherein the amount of air bubbles in a glass substrate is controlled so that the glass substrate, after laser machining, has a large surface area on the machined surface due to bubble traces in glass, thereby performing electroless plating simply.

The present invention is also characterized in that: the amount of air bubbles in a glass substrate is controlled so that the glass substrate, after laser machining, has a large surface area on the machined surface due to bubble traces in glass; and a metal film is formed to improve heat radiation property of the metal-film-formed portion.

The present invention is also characterized in that a $CO_2$ laser is used for laser machining.

Furthermore, the present invention provides a glass substrate machining method for using a $CO_2$ laser of variable pulse width as machining means, the method comprising: a first step of executing a single laser irradiation; and a second step of executing a plurality of laser irradiations.

The present invention also provides the glass substrate machining method described above, wherein the pulse width of the laser in the second step is greater than that in the first step.

Furthermore, the present invention provides a method of fabricating a high-frequency circuit by using the glass substrate machining method having the characteristics described above.

Moreover, the present invention provides a radio terminal apparatus comprising a high-frequency circuit fabricated by using the glass substrate machining method having the characteristics described above.

The present invention also provides a radio base station apparatus comprising a high-frequency circuit fabricated by using the glass substrate machining method having the characteristics described above.

The present invention also provides a radar apparatus comprising a high-frequency circuit fabricated by using the glass substrate machining method having the characteristics described above.

As has been described, according to the present invention, glass substrates which are typically difficult to machine can be easily applied to the fabrication of high-frequency circuits. This allows wide, public supply of high-performance circuits and apparatuses.

The foregoing objects and advantages of the present invention will become more apparent from the following description when read in conjunction with the accompanying drawings.

DESCRIPTION OF THE PREFERRED EMBODIMENTS

Figure 1:
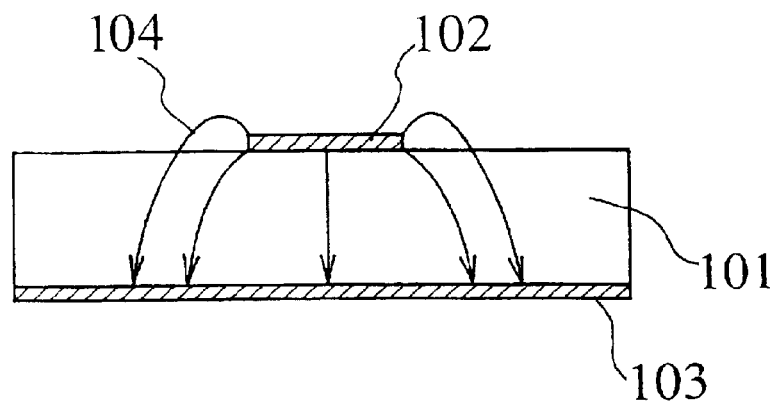
FIG. 1 is a conceptual diagram showing a problem that occurs when a conventional glass substrate is used.

Hereinafter, an embodiment of the present invention will be described with reference to the drawings. FIGS. 3(a) and 3(b) are cross-sectional views of a substrate consisting of glass that bears air bubbles. FIG. 3(a) shows a state before laser beam machining, and FIG. 3(b) a state after laser beam machining. In FIGS. 3(a) and 3(b), the reference numeral 1 represents the glass substrate, 2 bubbles in the glass substrate, and 3 a through hole formed by laser beam machining.

Figure 2:
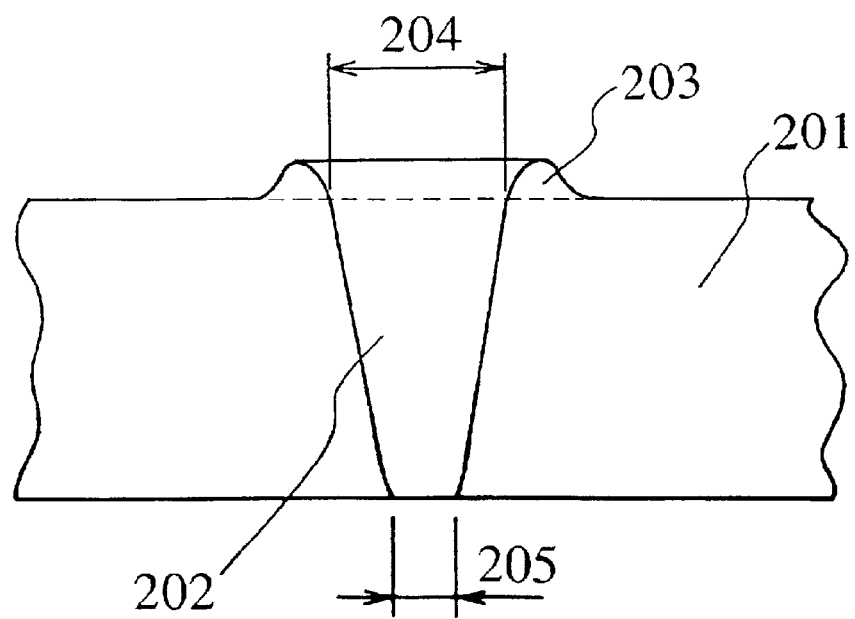
FIG. 2 is a conceptual diagram showing a problem that occurs when laser machining is applied to a conventional glass substrate.

The method for fabricating the bubble-bearing glass shown in FIG. 3(a) is publicly known as described in e.g. Japanese Patent Laid-Open Publication No. Hei 10-29836. Glass substrates with designated amounts of bubbles are made available by requesting from substrate suppliers. When a glass substrate bearing such a controlled amount of bubbles is used as a substrate intended for high-frequency circuits, it offers even the effect of reducing a loss during signal transmission since the substrate having a permittivity yet lower than those of ordinary glass substrates is in use. When the substrate consisting of bubble-bearing glass as shown in FIG. 3(a) is perforated by using a laser beam, the ratio of the hole diameter on the laser-irradiated side (top hole diameter) to the hole diameter on the side opposite to the laser-irradiated side (bottom hole diameter) approaches 1 as shown in FIG. 3(b). The upheaval 203 shown in FIG. 2 is also suppressed significantly. The reason for this is that while the laser irradiation thermally machines the glass, minute cracks successively arise between minute bubbles in the glass along the direction of the laser irradiation. These cracks propagate consecutively from the laser-irradiated side to the side opposite to the laser-irradiated side, thereby causing a machining phenomenon. As a result, machining with a smaller tendency to taper is achieved.

Moreover, the laser pulse energy necessary for forming the through hole in this glass substrate can be made several tens of percentages or much lower than that in forming a through hole in ordinary glass substrates. This can suppress the production of the upheaval shown in FIG. 2. Furthermore, the bubbles in the glass function to inhibit the heat inside the glass produced by the laser irradiation from diffusing in lateral directions of the glass substrate. This means that the laser-based thermal machining is performed effectively in the direction of the laser irradiation. Incidentally, due to the thermal machining by the laser beam, the laser-machined through hole has a smooth surface with asperities resulting from bubble traces that have molten away. Concerning the types of lasers to be used here, a $CO_2$ laser is more advantageously used for mass production processes. Nevertheless, KrF and other excimer lasers can also be used in the perforation to involve the crack-propagating machining of the bubbles. Here, the narrow process conditions for ordinary glass substrate machining are relaxed, and the glass machining itself can be performed satisfactorily under energy lower than in the ordinary glass substrate machining.

Among techniques for further improving the machined shape of the through hole 3 shown in FIG. 3(b) is a machining method using a $CO_2$ laser of variable pulse width, comprising a first step of performing laser irradiation only once and a second step of performing laser irradiation over a plurality of times. This method allows both the suppression of the taper and the suppression of the upheaval of the machined portion even in ordinary glass machining. FIGS. 4(a) and 4(b) show how a glass substrate is perforated by using the $CO_2$ laser of variable pulse width which can suppress the taper and the upheaval of the machined portion even in ordinary glass machining. FIGS. 4(a) and 4(b) both are cross-sectional views of a glass substrate 201 in which a through hole 202 is formed. FIG. 4(a) shows a cross section of the glass substrate having undergone only a single laser irradiation at the first step. FIG. 4(b) shows a cross section of the glass substrate having undergone a plurality of laser irradiations at the second step. The reason why such a shape as shown in FIG. 4(b) is obtained through the execution of a plurality of laser irradiations on the glass substrate at the second step is that the plurality of laser irradiations can increase the hole diameter on the side opposite to the laser-irradiated side (bottom hole diameter). Here, the diameter of the laser beam is unchanged irrespective of the number of irradiations; therefore, the hole diameter on the laser-irradiated side (top hole diameter) remains unchanged.

The reason why the execution of a plurality of laser irradiations at the second step reduces the upheaval is that an annealing effect on the periphery of the through hole evens out the upheaval. Applications of this machining method include a method of changing the pulse width of the laser irradiation between the first step and the second step, or shifting the focus of the laser in the depth direction of the through hole upon the second laser irradiation. These methods can be combined to form a more perpendicular through hole in a glass substrate. In this connection, the method of making the laser pulse width in the second step greater than in the first step, if adopted, enhances the annealing effect of suppressing the upheaval. When these methods are used to conduct the formation of a through hole in the substrate consisting of bubble-bearing glass shown in FIG. 3(a), a through hole of favorable shape can be formed with energy less than in ordinary glass machining. The machining method described above can be used to form not only the through holes but also grooves and vacancies which are difficult to form by ordinary glass machining.

Figure 5:
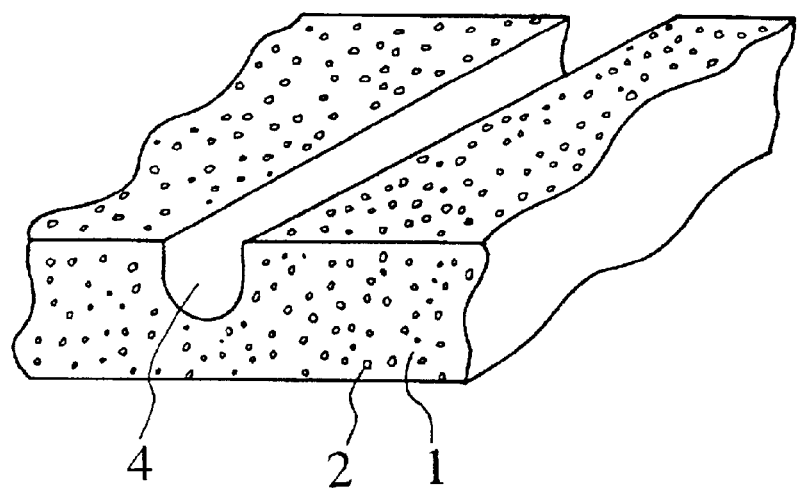
FIG. 5 is an explanatory diagram showing a method of machining a glass substrate according to an embodiment of the present invention.
Figure 6:
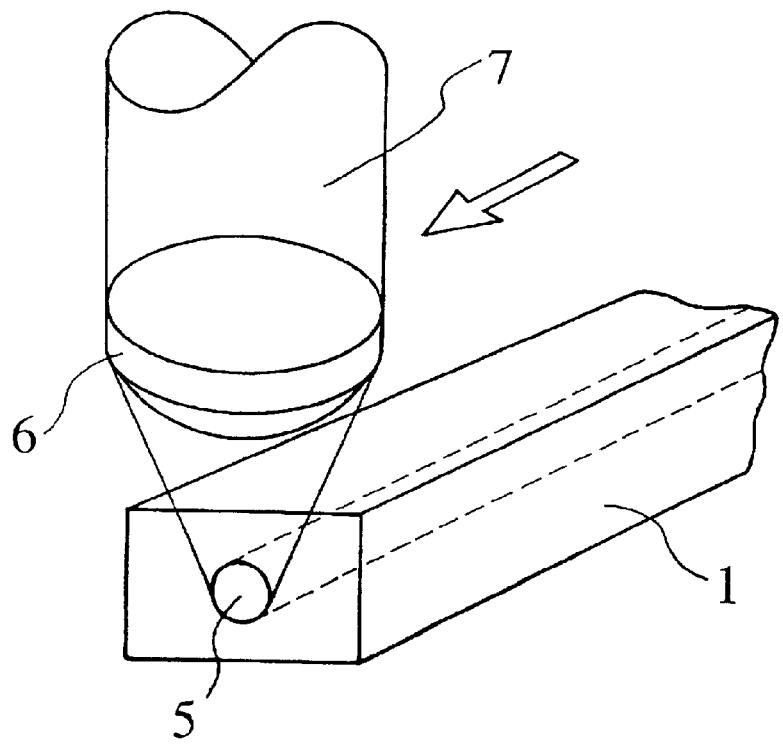
FIG. 6 is an explanatory diagram showing a method of machining a glass substrate according to an embodiment of the present invention.

FIG. 5 shows an example of the result of groove machining. In FIG. 5, the reference numeral 4 represents a groove formed in a section of a substrate 1 that consists of bubble-bearing glass. This groove can be formed by shifting a laser beam relative to the bubble-bearing glass substrate. FIG. 6 shows a machining method for forming a vacancy inside a bubble-bearing glass substrate. In FIG. 6, the reference numeral 1 represents a substrate consisting of bubble-bearing glass, 5 a vacancy formed inside the glass, 6 a lens for focusing a laser beam, and 7 the laser beam. The laser beam 7 is condensed by the lens 6 into focus on a portion of 5 in the bubble-bearing glass substrate 1. In this condition, the laser beam and the substrate 1 are relatively shifted so that minute cracks successively occur between minute bubbles inside the glass substrate 1, along with thermal machining. This makes it possible to form the vacancy 5 inside the glass substrate 1.

In this connection, it is desirable to use here a laser having a higher peak output. Lasers of lower peak outputs, if used, fail to form vacancies, but the groove shape shown in FIG. 5 would result.

Figure 3:
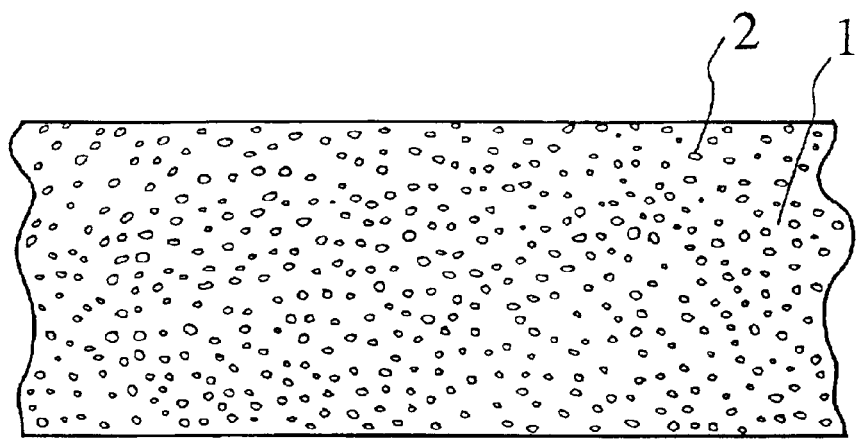
FIGS. 3(a) and 3(b) are explanatory diagrams showing a method of machining a glass substrate according to an embodiment of the present invention.
Figure 3:
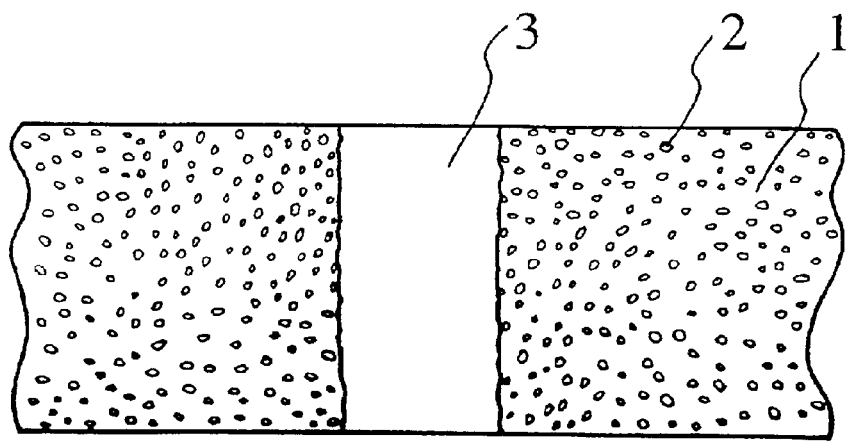
Figure 4:
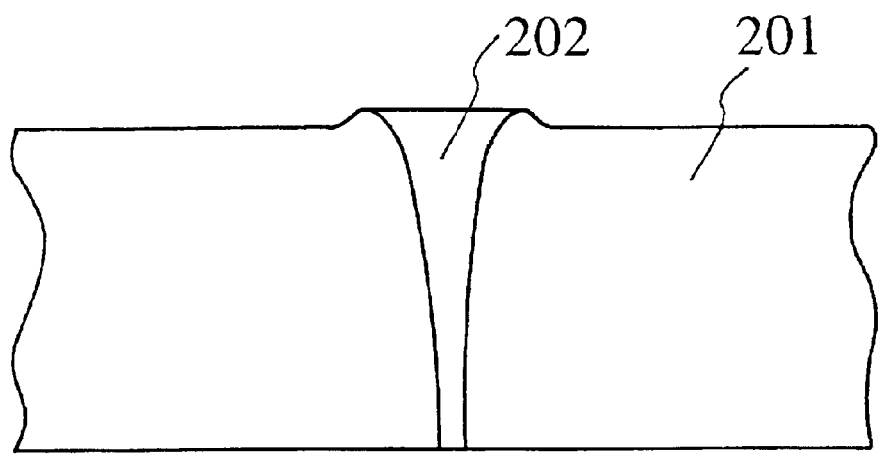
FIGS. 4(a) and 4(b) are explanatory diagrams showing how a glass substrate is machined with a laser.
Figure 4:
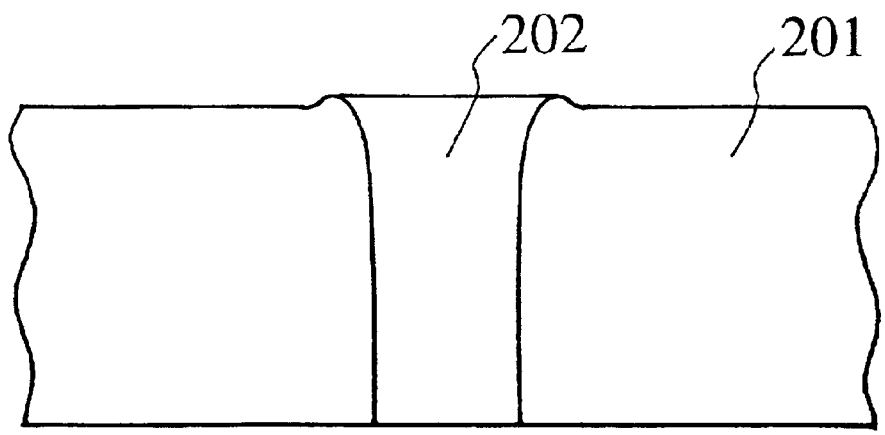
Figure 7:
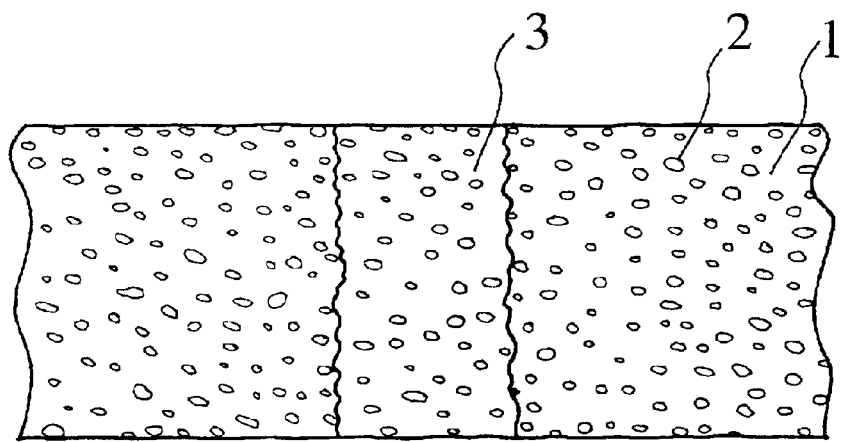
FIG. 7 is an explanatory diagram showing a method of machining a glass substrate according to an embodiment of the present invention.

The machining methods described in conjunction with FIGS. 3 and 5, when combined with an increase in the diameter of each bubble mixed in the glass substrate 1, can provide other effects. Here, in general the bubble diameter is desirably greater than or equal to 50 $\mu$m. FIG. 7 shows in cross section a glass substrate 1 bearing bubbles 2 of somewhat greater diameters, with a through hole formed therein by a laser. In this glass substrate machining method, the wall of the through hole 3 undergoing the thermal effect of the laser becomes an uneven surface, not a completely smooth one, because the bubbles 2 are of a certain size. The uneven surface condition of the through hole acts to the advantage of circuit substrate fabrication. In typical circuit substrate fabrication, through holes are formed for the purpose of establishing electric connection between the circuits on the front and on the back. Metal films are formed over the walls of the through holes. For example, the metal films for electric connection are formed by electroless-plating thin metal films, and then electroplating the metal films up to a certain thickness (approximately 10 $\mu$m or smaller). This electroless plating step involves roughening, or a step of intentionally coarsening surfaces to be plated, because sufficient bond strength cannot be obtained if the surfaces are smooth. The provision of uneven through hole surfaces as in the present invention eliminates the need for the roughening step, and thus is advantageous for mass production and fabrication of circuit substrates.

Figure 8:
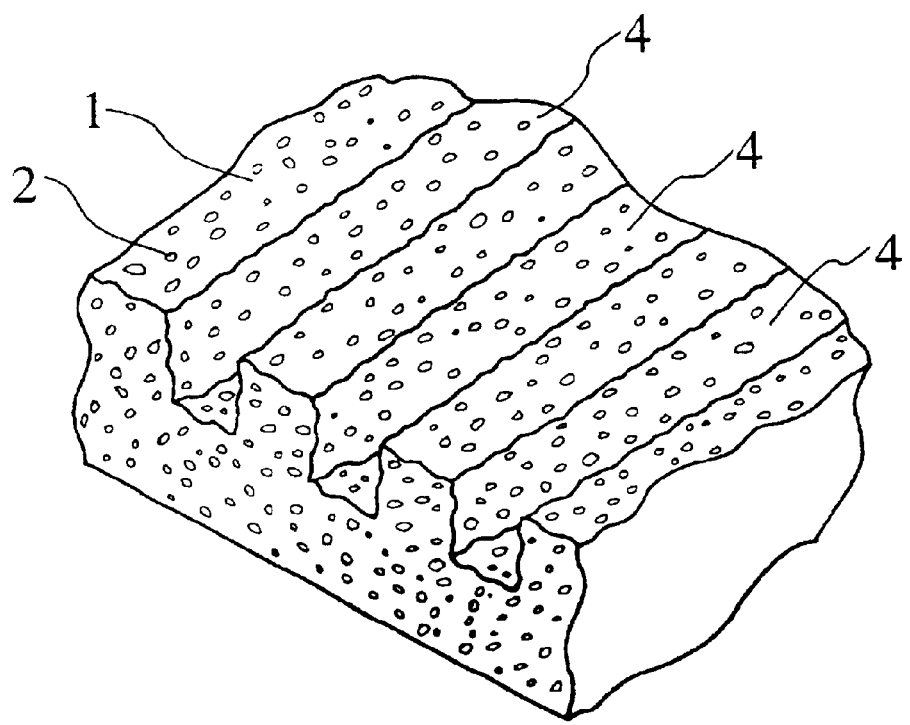
FIG. 8 is an explanatory diagram showing a method of machining a glass substrate according to an embodiment of the present invention.

FIG. 8 shows an example where a number of grooves are laser-formed in a glass substrate 1 bearing bubbles 2 of somewhat greater diameters. This kind of machining can create a surface having a surface area far greater than in ordinary glass substrates. Such an uneven surface, if a metal film or other thin film of high heat conductivity is formed thereon, can make a surface of high heat radiation. Then, this surface can be applied to heat-radiation-critical circuit substrates to fabricate high-performance circuit substrates.

Figure 9:
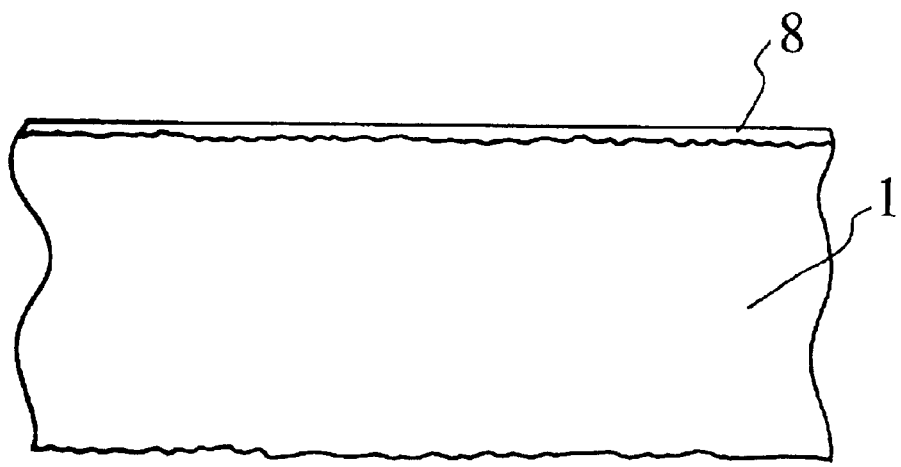
FIGS. 9(a) and 9(b) are explanatory diagrams showing a method of machining a glass substrate according to an embodiment of the present invention.
Figure 9:
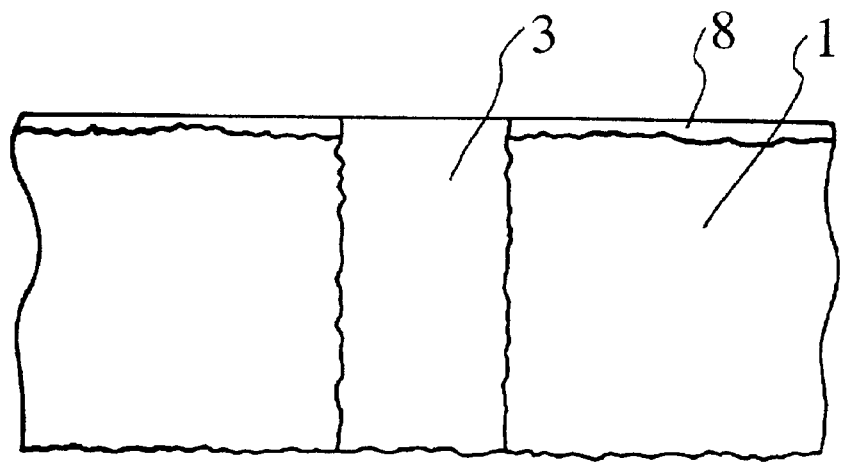

In fabricating high-frequency circuits on bubble-bearing glass substrates, and particularly in the cases of adopting larger bubbles described in conjunction with FIGS. 7 and 8, the surface roughness of portions for transmission lines to be formed on sometimes becomes crucial to the circuits which deal with high frequencies of a microwave band or a millimeter wave band. The reason is that the transmission lines formed on rough-surfaced substrates come to have asperities, which can cause losses in signal transmission and/or increase the actual line lengths because of increased surface areas. This problem can be avoided by forming insulator films on the surfaces of the bubble-bearing glass substrates. FIGS. 9(a) and 9(b) show a method for solving the above-mentioned problem by forming an insulator on a bubble-bearing substrate 1.

FIG. 9(a) is a cross-sectional view of the substrate before laser beam machining, in which the reference numeral 8 represents an insulator. Concerning the material of the insulator 8, it is preferable to select a material having planarization effect to asperities from among spin-on-glass (SOG) and other insulators which can be easily formed by coating. Moreover, polyimide, benzocyclobutene, and other organic insulator films can be formed with greater thicknesses and improved asperity planarization effect as compared with SOG and other inorganic substances. The formation of the polyimide and benzocyclobutene films are typically formed by spin coating and a following step of hardening, through, but not limited to, coating-based methods such as the spin coating. The organic films may be formed in a laminator. FIG. 9(b) shows a state where a through hole is formed by a laser. There lies an SOG or other inorganic material film of several micrometers, a polyimide or benzocyclobutene coating of the order of 10–50 $\mu$m, or a laminator-formed organic film of the order of 20–70 $\mu$m. These substances will not hinder the formation of the through hole 3 since they have far superior laser workability as compared to glass substrates. Forming transmission lines on the insulator 8 solves the above-mentioned problem.

When high-frequency circuits are fabricated by using the method of machining a glass substrate according to the present invention, it becomes possible to manufacture circuits of higher performance and excellent mass productivity. In addition, the high-frequency circuit according to the present invention is applicable to radio portable terminals, radio base stations, radar apparatuses, and the like, and it is possible to produce high-performance mass-producible apparatuses.

What is claimed is:

1. A glass substrate machining method comprising the steps of:

machining a glass substrate by using a laser;

controlling an amount of air bubbles in said glass substrate; and controlling a condensation of the laser in a manner that the laser beam is condensed into focus on an inside portion of the bubble-bearing glass substrate;

wherein a cavity or bore is formed only inside of said glass substrate.

2. The glass substrate machining method according to claim 1, wherein a $CO_2$ laser is used to perform the laser machining.

* * * * *